(12) United States Patent
Graddy, Jr. et al.

(10) Patent No.: US 11,084,950 B2
(45) Date of Patent: Aug. 10, 2021

(54) FAST CONDUCTIVITY POLYMER SILVER

(71) Applicant: Ferro Corporation, Mayfield Heights, OH (US)

(72) Inventors: G. Edward Graddy, Jr., Del Mar, CA (US); Ben E. Cruz, Chula Vista, CA (US)

(73) Assignee: Ferro Corporation, Mayfield Heights, OH (US)

(*) Notice: Subject to any disclaimer, the term of this patent is extended or adjusted under 35 U.S.C. 154(b) by 0 days.

(21) Appl. No.: 16/067,624

(22) PCT Filed: Mar. 10, 2017

(86) PCT No.: PCT/US2017/021708
§ 371 (c)(1),
(2) Date: Jul. 2, 2018

(87) PCT Pub. No.: WO2017/165127
PCT Pub. Date: Sep. 28, 2017

(65) Prior Publication Data
US 2019/0002723 A1    Jan. 3, 2019

Related U.S. Application Data

(60) Provisional application No. 62/312,756, filed on Mar. 24, 2016.

(51) Int. Cl.
C09D 11/52    (2014.01)
C09D 5/24     (2006.01)
(Continued)

(52) U.S. Cl.
CPC ............ C09D 11/52 (2013.01); B41M 3/006 (2013.01); C08K 3/08 (2013.01); C08K 5/06 (2013.01);
(Continued)

(58) Field of Classification Search
CPC ....... C09D 11/52; C09D 11/20; C09D 11/033; C09D 5/24; H05K 3/12; H05K 1/00;
(Continued)

(56) References Cited

U.S. PATENT DOCUMENTS 3,328,317 A * 6/1967 McKeand ............... H01B 1/24
                                                       252/511
4,390,594 A   6/1983 Dages
(Continued)

FOREIGN PATENT DOCUMENTS

JP    56159006    * 12/1981
WO    02/060988 A1   8/2002

OTHER PUBLICATIONS

Document#1 http://cameo.mfa.org/wiki/Ethyl_cellulose (Year: NA).*
(Continued)

Primary Examiner — Tabassom Tadayyon Eslami
(74) Attorney, Agent, or Firm — Christopher Jan Korff; Rankin Hill & Clark LLP

(57) ABSTRACT

A conductive paste is provided for forming conductive traces on substrates. The conductive paste includes a vehicle and conductive material. The vehicle includes a resin, a plasticizer, and a solvent in which the resin is dissolved. After application to a substrate, the conductive paste is cured at ambient temperature by evaporation of the solvent from the paste, to thereby form a conductive trace on the substrate. The conductive trace does not require a curing agent, and attains low resistivity within minutes of application to the substrate.

27 Claims, 7 Drawing Sheets

(51) Int. Cl.

| | |
|---|---|
| *C09D 129/14* | (2006.01) |
| *H01B 1/22* | (2006.01) |
| *C08K 3/08* | (2006.01) |
| *C09D 7/61* | (2018.01) |
| *C08K 5/103* | (2006.01) |
| *C08K 5/06* | (2006.01) |
| *C09D 5/38* | (2006.01) |
| *C09D 7/20* | (2018.01) |
| *B41M 3/00* | (2006.01) |
| *C09D 11/033* | (2014.01) |
| *C09D 11/037* | (2014.01) |
| *C09D 11/106* | (2014.01) |
| *H05K 1/09* | (2006.01) |
| *H05K 3/12* | (2006.01) |

(52) U.S. Cl.
CPC ............... *C08K 5/103* (2013.01); *C09D 5/24* (2013.01); *C09D 5/38* (2013.01); *C09D 7/20* (2018.01); *C09D 7/61* (2018.01); *C09D 11/033* (2013.01); *C09D 11/037* (2013.01); *C09D 11/106* (2013.01); *C09D 129/14* (2013.01); *H01B 1/22* (2013.01); *H05K 1/095* (2013.01); *H05K 3/1283* (2013.01); *C08K 2003/0806* (2013.01); *C08K 2201/001* (2013.01)

(58) Field of Classification Search
CPC ...... H05K 3/125; H05K 3/321; H05K 3/1283; H05K 3/323; G02F 1/133305; C08K 2201/001; C08K 2003/0806; H01B 1/22; H01B 1/20; B41M 3/006
USPC ........................................................ 252/514
See application file for complete search history.

(56) References Cited

U.S. PATENT DOCUMENTS

| | | | |
|---|---|---|---|
| 4,679,320 A * | 7/1987 | Imanaka | ............. H01L 21/4867 156/89.18 |
| 5,434,207 A | 7/1995 | Fischer | |
| 5,618,863 A | 4/1997 | D'Errico et al. | |
| 6,620,872 B2 | 9/2003 | Fisher | |
| 8,323,534 B2 | 12/2012 | Percec et al. | |
| 9,023,253 B2 | 5/2015 | Liu et al. | |
| 2009/0246486 A1* | 10/2009 | Sasaki | .................. H05K 9/0096 428/203 |
| 2009/0258241 A1* | 10/2009 | Shiraishi | ................ C09D 11/30 428/457 |
| 2010/0068476 A1* | 3/2010 | Jeremic | ................ C09D 11/101 428/195.1 |
| 2011/0126899 A1* | 6/2011 | Abe | ...................... C23C 30/005 136/256 |
| 2011/0260115 A1* | 10/2011 | Kim | ...................... B82Y 10/00 252/503 |
| 2011/0303885 A1* | 12/2011 | Vanheusden | ............. H01B 1/22 252/513 |
| 2011/0308614 A1* | 12/2011 | Cartagena | ....... H01L 31/022425 136/261 |
| 2013/0148263 A1* | 6/2013 | Shimazumi | ......... C04B 35/4682 361/321.1 |
| 2013/0228207 A1 | 9/2013 | Wang et al. | |
| 2014/0318618 A1* | 10/2014 | Paik | ......................... B22F 9/24 136/256 |
| 2014/0374671 A1 | 12/2014 | Chopra et al. | |
| 2014/0374672 A1 | 12/2014 | Chopra et al. | |
| 2014/0377454 A1 | 12/2014 | Iftime et al. | |
| 2015/0104625 A1 | 4/2015 | Shiozawa | |
| 2015/0240099 A1 | 4/2015 | Chopra et al. | |
| 2015/0240100 A1* | 8/2015 | Liu | ..................... C09D 11/037 252/514 |
| 2015/0259556 A1 | 9/2015 | Chopra et al. | |
| 2015/0262728 A1* | 9/2015 | Ogiwara | .................. H01B 1/22 427/98.4 |
| 2015/0322276 A1* | 11/2015 | Cao | ......................... H05K 1/095 427/98.4 |
| 2017/0306172 A1* | 10/2017 | Koduma | ................... C09C 1/62 |
| 2018/0182506 A1* | 6/2018 | Gao | ................. H01L 31/02168 |

OTHER PUBLICATIONS

International Search Report for corresponding PCT/US2017/021708 dated Jun. 8, 2017, one page.
"Butvar Polyvinyl Butyral (PVB) Resins" http://www.chiefup.com.tw/data/electronic_ceramic_division/pvb_resins/pvb_resins.htm, three pages.

* cited by examiner

LENS Z20:X100

LENS Z20:X100

50.00μm

FAST CONDUCTIVITY POLYMER SILVER

FIELD

The present subject matter relates to polymer conductive pastes, conductive traces, and related methods.

BACKGROUND

Conductive pastes including silver flakes are known for forming conductive traces on substrates. These materials are compatible with a large range of substrates and devices, and are most commonly used in RFID applications or other electronic devices.

Various conductive paste formulations include glass frit. These glass frit conductive pastes after having been applied to a substrate, necessarily require a firing step to remove any volatile component from the pastes and to sinter the glass frit. Therefore, production of these conductive traces necessarily requires specific heating equipment, such as a firing oven, lehr, or kiln, and result in longer production times because of the necessary step of sintering the glass frit. Furthermore, these pastes typically result in a rigid conductive trace that is susceptible to damage or degradation due to bending.

Other types of conductive pastes formulations are known as polymer conductive pastes, which typically include a curable polymer heavily loaded with a conducting material. The polymer conductive pastes are applied to a substrate and the polymer is cured by means of radiation (e.g. ultraviolet), catalytically, or thermally at elevated temperatures. Such processes necessarily require a certain amount of time to complete the curing of the polymer, and therefore delay when the completed circuit including such conductive trace attains full functionality, and thus delay the programming or use of the electronic device including such circuit. Catalytically cured paste formulations have a limited pot life due to the addition of a curing catalyst to the pastes, and therefore require that the entire batch be used within a certain amount of time before the pastes cure, or else there will be a resulting waste of the unused portion of the batch. Thermally curing processes necessarily require substrates that are not adversely affected by the increased temperature, and thus limit the type of substrates that can be used in these applications.

As such, there exists a need for improved conductive paste formulations that address the shortcomings of the previous formulations.

SUMMARY

The difficulties and drawbacks associated with previously known systems are addressed in the present compositions, methods, and assemblies.

There is a growing demand for polymer silver conductors capable of achieving electrical conductivity in a very short amount of time. There is also a need for these materials to cure without the need for heating the materials, i.e. at ambient temperature, with a resultant film that is highly flexible. The present invention consists of polymer conductive pastes that are easily applied to a substrate, achieve rapid electrical conductivity at ambient temperature, and produce a flexible conductive trace by means of an evaporative curing process with a highly plasticized resin system. The present conductive pastes do not require a curing agent, i.e. irradiating the paste with radiation (e.g. ultraviolet light), introducing a curing catalyst into the composition, or subjecting the paste to elevated temperatures above ambient temperature. In one embodiment, the methods of forming a conductive trace do not include using a curing agent to cure the paste.

In one aspect, the present subject matter provides a lead, cadmium, and phthalate free conductive paste. The paste comprises about 5-35 wt % of a binder system, about 60-90 wt % conductive material, and about 0.05-0.15 wt % defoamer. The binder system includes polymer resin, plasticizer, and solvent. The polymer resin is dissolved in the solvent. A weight ratio of the amount of polymer resin to the amount of plasticizer is about 1.25 to about 1.75. The solvent evaporates at ambient temperature at a rate of about 0.5-1 wt % in the first 5 minutes after application of the conductive paste to an associated substrate. The conductive paste achieves an electrical resistance of less than $1.00 \times 10^4$ ohms (0) on a predetermined pattern within 1 minute from application of the conductive paste to the substrate and less than 1 ohm on the predetermined pattern within 5 minutes from application of the conductive paste to the substrate, to thereby form a flexible conductive trace at ambient temperature.

In another aspect, the present subject matter provides a method of forming a conductive trace. The method includes providing a conductive paste comprising about 5-35 wt % of a binder system, about 60-90 wt % conductive material, and about 0.05-0.15 wt % defoamer. The binder system includes polymer resin and plasticizer dissolved in a solvent. A weight ratio of the amount of polymer resin to the amount of plasticizer is about 1.25 to about 1.75. The method includes applying the conductive paste to a substrate in a predetermined pattern, and curing the conductive paste at ambient temperature by allowing the solvent to evaporate from the conductive paste, thereby forming a flexible conductive trace on the substrate. The solvent evaporates at ambient temperature at a rate of about 0.5-1 wt % in the first 5 minutes after application of the conductive paste to the substrate. The flexible conductive trace achieves an electrical resistance of less than $1.00 \times 10^4$ ohms ($\Omega$) on the predetermined pattern within 1 minute from application to the substrate, and less than 1 ohm on the predetermined pattern within 5 minutes from application to the substrate at ambient temperature.

As will be realized, the subject matter described herein is capable of other and different embodiments and its several details are capable of modifications in various respects, all without departing from the claimed subject matter. Accordingly, the drawings and description are to be regarded as illustrative and not restrictive.

DETAILED DESCRIPTION OF THE EMBODIMENTS

Figure 1:
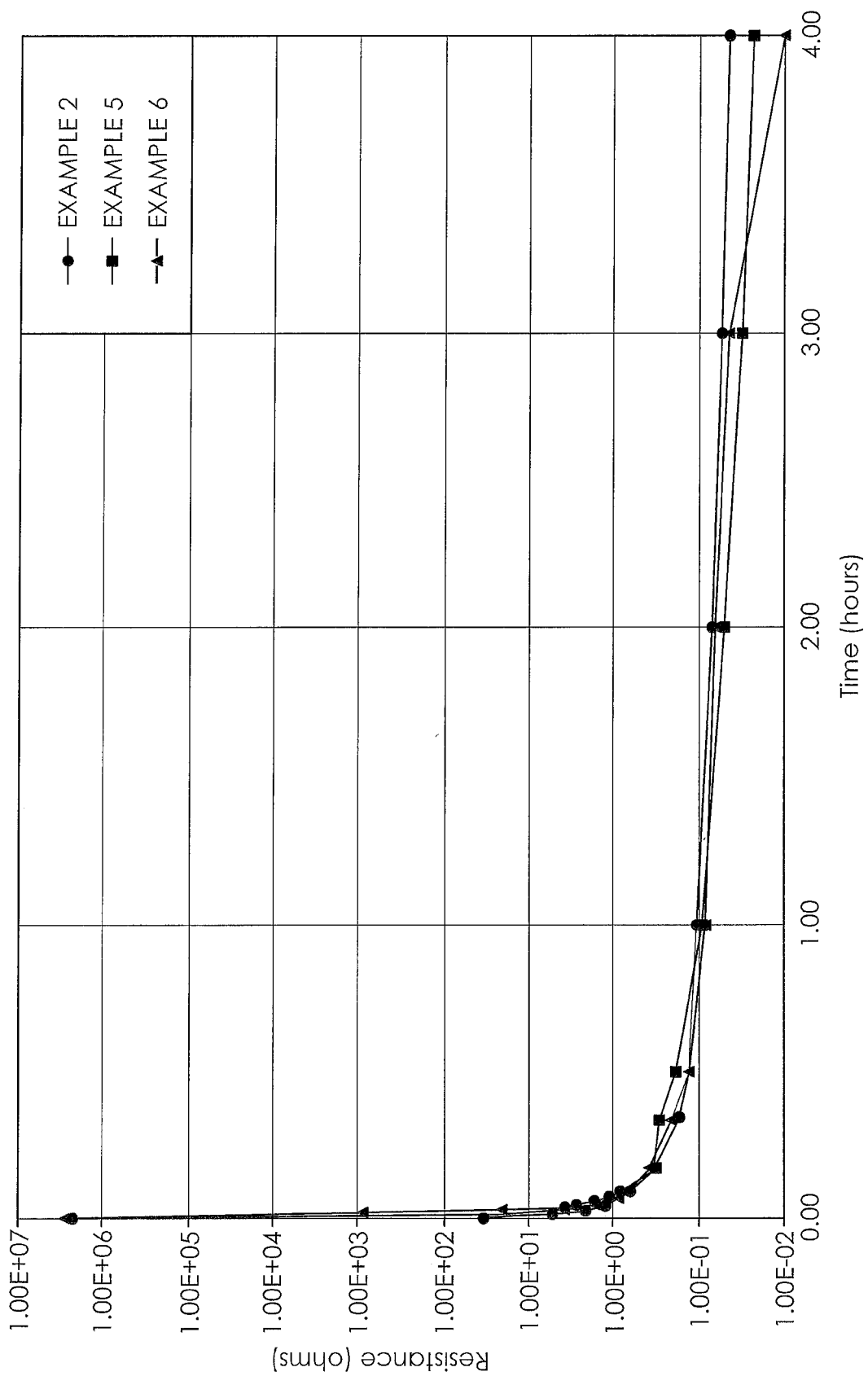
FIG. 1 is a graph of recorded data for the resistance of example conductive pastes in accordance with the present subject matter with respect to time.

The subject matter described herein provides a conductive paste system for forming conductive traces at ambient temperature. The system does not require a curing agent (i.e. radiation, catalyst, heat), sintering of the conductive paste, or special storage or transport requirements. The system provides an extended shelf life and pot life, and is compatible with REACH and ROHS regulations.

The present subject matter relates to conductive paste compositions and formulas that are used to form a conductive trace. The inventive conductive pastes includes conductive material and a vehicle, including a thermoplastic polymer dissolved in a solvent, along with a significant amount of plasticizer. A defoamer, and a gelling agent can be added to the formulation, which is applied to a substrate in a predetermined pattern. After the paste is applied to a substrate, the thermoplastic polymer is cured by evaporation of the solvent, which result in a flexible conductive trace having low electrical resistivity. In several embodiments, evaporation of the solvent is accomplished at ambient temperature (e.g. room temperature, about 23° C.).

The amount and evaporation rate of the solvent is tailored to allow for the conductive paste to quickly develop into a conductive trace. The quick-curing conductive paste provides, upon curing, a conductive trace that attains almost immediate electrical conductivity when used in an electronic circuit in an electronic device. The present invention provides an electrical/electric/electronic device including such conductive traces, and in such devices allows for electronic device recognition very soon after device assembly, immediate programming of an electronic device that utilizes the electronic circuit, a reduction in production time of such electronic devices, and a corresponding increase in production output of such devices.

Certain aspects of the invention provide a final conductive trace formed using the conductive pastes described herein, which conductive trace is flexible and able to withstand being subjected to bending, twisting, and flexing, while still retaining electrical conductivity. Such conductive traces are flexible in that when the inventive pastes are applied by screen printing at a coating thickness of 35-100 µm and cured to a brass sheet having a thickness of 0.35 mm, and when the brass sheet is bent, the conductive trace exhibit no stress cracking when observed under 100 times magnification. In one embodiment, the conductive trace has a modulus of elasticity of about $1-4 \times 10^3$ psi as measured by ASTM D790-59T. One application for these flexible conductive traces is a Dual Interface or 'Combi' card used for wireless transactions and identity verification.

In accordance with the invention, there is provided a method for forming an electrical conductor pattern or circuit on a substrate. The method comprises the steps of applying a predetermined pattern of the inventive conductive paste on a substrate and curing the conductive paste at ambient temperature (e.g. about 23° C.). It has been found that the conductors formed by the present process provide substantial improvements over the existing conductive polymer pastes. The aforementioned disadvantages present in other types of conductive pastes, are mostly non-existent and the inventive process lends itself to the formation of conductors on a large variety of substrates.

Unless otherwise noted, all compositional percentages disclosed herein are by weight and are given for a blend prior to curing/hardening. Numerical ranges of oxides or other ingredients that are bounded by zero on the lower end (for example, 0-7% by weight) are intended to provide support for the concept "up to [the upper limit]." Of the ingredients. For example, "0-7% by weight SrO" is intended to provide support for "up to 7% SrO by weight" as well as a positive recitation that SrO is present at some amount, for example at 0.01 wt % or 0.1 wt %, and in an amount that does not exceed the upper limit. An example of the latter is "comprises SrO, provided the amount does not exceed 10% by weight."

All ranges disclosed herein are to be understood to encompass the beginning and ending range values and any and all subranges therein. For example, a stated range of "7 wt % to 17 wt %" should be considered to include any and all subranges between (and inclusive of) the minimum value of 7 and the maximum value of 17; that is, all subranges beginning with a minimum value of 7 or more and ending with a maximum value of 17 or less, e.g., 7.0 to 8.7, 9.3 to 12.9, 11.7 to 17, etc.

The conductive pastes, prior to curing/hardening by evaporating the solvent, can comprise about 40-98 weight percent (wt %), about 50-95 wt %, about 65-95 wt %, about 60-90 wt %, about 70-85 wt %, or about 80-85 wt % of conductive material, which can include silver particles (e.g. flakes); and about 2-60 wt %, about 5-50 wt %, about 5-35 wt %, about 10-30 wt %, about 15-30 wt %, or about 15-20 wt % of the vehicle.

Several details of the conductive paste, cured conductive trace, and related methods will be described in more detail herein.

Vehicle

The conductive pastes of the present subject matter include a vehicle (also referred to herein as a "binder system"), which comprises a polymer resin, a plasticizer, and one or more solvents. The vehicle is used to deliver the conductive material to a substrate, and after volatilization of the solvent, secures/bonds the conductive material to the substrate in order to form a conductive trace on the substrate. The electrical conductivity of the trace is provided by the conductive material, e.g. silver flakes loaded into the vehicle. The polymer resin is dissolved in the solvent, thereby defining a liquid vehicle able to be applied to the substrate through known liquid application techniques. The viscosity, curing rate, and other characteristics of the vehicle can be tailored as desired for particular applications.

Resin

The inventive conductive pastes utilize a thermoplastic resin that is capable of being dissolved in the solvent, and curing at ambient temperature upon evaporation of the solvent from the conductive paste after application to a substrate.

The thermoplastic resin is not particularly limited by the present subject matter, and can include one or more homopolymers, copolymers, or physical mixtures of acetylene acrylate esters, acrylics, acrylonitrile, acrylonitrile butadiene styrenes (ABS), alkyl vinyl ethers, aryl sulfonates, butadienes, cellulose triacetates, chloroprenes, ethylene phthalamides, formaldehyde, isobutenes, isoprene hydrocarbons, maleic anhydrides, methacrylate esters, nylons, polylactic acids (PLA), polybenzimidazoles, polycarbonates, polyether sulfones, polyetherether ketones, polyetherimides, polyethylenes, polyethylene terephthalates, polyethylene oxides, polyphenylene oxides, polyphenylene sulfides, 1,4-Phenylene ethylene, phenylene sulfones, phenyl glycidyl ethers, pyromellitimides, polypropylenes, propylene oxides, polysiloxanes, polystyrenes, thiophenylenes, ureas, polyurethanes, polyvinyl acetals, polyvinyl acetates, polyvinyl carbazoles, polyvinylidene chloride, polyvinylidene fluoride, polyvinyl pyrrolidones, polyvinyl chlorides (PVC), polytetrafluoroethylenes, phenoxy resins, and polyvinyl butyrals (PVB).

In several embodiments, the resin includes polyvinyl butyral (PVB). In one aspect, the resin consists of PVB. Polyvinyl butyral is an amorphous random copolymer of vinyl butyral, vinyl alcohol, and vinyl acetate. Commercial PVB contains approximately, 10-20% vinyl alcohol, 0.1-3% vinyl acetate and 75-90% vinyl butyral units.

The PVB may have a weight average molecular weight (Mw) of about 100,000 to about 1,500,000 Daltons (Da), such as from about 150,000 to about 500,000 Da, and from about 200,000 to about 400,000 Da, or from about 400,000 to about 1,2500,000 Da, and from about 500,000 to about 1,000,000. The Tg of the PVB is from, for example, about 60° C. to about 100° C., such as from about 60° C. to about 85° C. or from about 62° C. to about 78° C.

Suitable PVB resins include those in the Butvar® line of resins available from Eastman Chemical Company, including Butvar® B-98 and B-76. Other examples of suitable PVB include, for example, polymers manufactured under the trade name MOWITAL (Kuraray America), S-LEC (Sekisui Chemical Company), and PIOLOFORM (Wacker Chemical Company).

In several embodiments, the resin includes phenoxy resin. In one, aspect, the resin consists of phenoxy resin. Phenoxy resins are thermoplastic copolymers of bisphenol A and epichlorohydrin. The phenoxy resin may have a weight average molecular weight (Mw) of about 25,000 to about 250,000 Daltons (Da), such as from about 30,000 to about 200,000 Da, and from about 40,000 to about 100,000 Da, or from about 50,000 to about 60,000 Da. The Tg of the phenoxy resin is from, for example, about 60° C. to about 150° C., such as from about 70° C. to about 120° C. or from about 90° C. to about 100° C. Suitable phenoxy resins include solid pellets in the PKHH line of resins available from Gabriel Performance Products, Inc.

Of 100 weight percent (wt %) of the vehicle, the polymer resin may be included in an amount of from about 5-30 wt %, from about 7.5-25 wt %, from about 10-20 wt %, or about 12.5-17.5 wt %. The polymer resin may be included in the conductive paste in an amount of from about 0.25-10.5 wt %, from about 0.75-7 wt %, from about 1.25-5 wt %, or from about 1.5-3 wt %.

Plasticizer

The vehicle includes a plasticizer, which allows for less polymer resin to be used in the overall conductive paste. Having a reduce amount of polymer resin in the conductive paste enables the trace to more quickly reach low electrical resistivity, yet also provides a flexible trace that is resistant to stress cracking. In one embodiment, a weight ratio of the amount of polymer resin to the amount of plasticizer is about 1 to 2, or about 1.25 to 1.75, or about 1.4-1.6, or about 1.5.

The plasticizer may be one or more of triethylene glycol bis(2-ethylhexanoate), diethylene glycol di-n-hexanoate, triethylene glycol di-n-hexanoate, triethylene glycol di-2-methyl pentanoate, pentaethylene glycol di-2-ethylbutyrate, triethyleneglycol-di-2-ethylbutyrate, dibutyl sebacate, tetraethylenglycol-di-heptanoate, di(propylene glycol) dibenzoate, triethylene glycol caprate caprylate, butyl benzyl phthalate, dioctyl phthalate, benzyl octyl, adipate, benzyl hexyl adipate, benzyl butyl adipate, benzyl decyl adipate, dibutyl adipate, di-n-pentyl adipate, di-n-hexyl adipate, di-n-heptyl adipate, di-n-octyl adipate, diethylene glycol di-2-ethylbutyrate, triethylene glycol di-2-ethylbutyrate, tetraethylene glycol di-2-ethylbutyrate, linseed oil, tributyl citrate, alkyl benzyl phthalate, dibutyl phthalate, dialkyl phthalate, dioctyl phthalate, butyl ricinoleate, toluenesulfonamide, n-ethyl toluenesulfonamide, (2-ethylhexyl diphenyl phosphate, isodecyl diphenyl phosphate, tert-butylphenyl diphenyl phosphate, triaryl phosphate ester blend, tricresyl phosphate, tricresyl phosphate, polyoxyethylene aryl ether, castor oil, methyl hydrogenated rosinate, or combinations thereof.

In one embodiment, the plasticizer comprises triethylene glycol bis(2-ethylhexanoate). In one aspect, the plasticizer consists of triethylene glycol bis(2-ethylhexanoate). Suitable plasticizers include Solusolv S-2075 available from Eastman Chemical Company; Oxsoft 3G8 available from OXEA Corporation; and Plasthall 4141 available from The Hallstar Company. The plasticizer may be compounded with the polymer resin before, during, or after introducing of the solvent.

The plasticizer may be included in the vehicle in an amount of from about 4-20 wt %, from about 5-20 wt %, from about 5-15 wt %, from about 6.5-13.5 wt %, or about 8-10 wt %. The plasticizer may be included in the conductive paste in an amount of from about 0.2-7 wt %, from about 0.5-5 wt %, from about 0.8-3 wt %, or from about 1-2 wt %.

Solvent

The vehicle includes one or more solvents, which dissolves the polymer resin and provides a liquid vehicle for delivering the conductive material to a substrate. The solvent(s) is chosen to have a specific evaporation rate, which is slow enough so that a batch of conductive paste does not cure too quickly and thus has a sufficiently long pot life, yet is fast enough so that the solvent quickly evaporates from the paste after application to a substrate to reach low resistivity. In one embodiment, the solvent evaporates at ambient temperature by about 0.1-5 wt %, or 0.2-1.5 wt %, or 0.5-1 wt % at the five-minute mark after application of the conductive paste to an associated substrate. In one aspect, such solvent evaporation results in the conductive paste achieving an electrical resistance of less than $1.00 \times 10^4$ ohms ($\Omega$) on a predetermined pattern within 1 minute from application of the conductive paste to the substrate, to thereby form a flexible conductive trace. In another embodiment, the conductive paste achieves an electrical resistance of less than 1 ohm ($\Omega$) on a predetermined pattern within 5 minutes from application of the conductive paste to the substrate.

The polymer resin and plasticizer are typically added to one or more organic solvents by mechanical mixing, thereby forming the vehicle. The solvents are not particularly limited by the present subject matter. In several embodiments, the one or more solvents are capable of dissolving the polymer resin to provide the vehicle in the form of a polymer solution.

The solvent may be a single solvent or a mixture of solvents that dissolve the thermoplastic resin and that can quickly evaporate at ambient temperatures following application of the conductive paste to a substrate. The solvent may be an ester-based solvent, ketone-based solvent, glycol ether-based solvent, aliphatic solvent, aromatic solvent, alcohol-based solvent, ether-based solvent, or the like.

Suitable solvents include, for example, acetic acid (e.g. glacial), acetone, n-butanol, 2-butoxyethanol, n-butyl acetate, n-butyl alcohol, n-butyl propionate, cyclohexanone, diacetone alcohol, diethylene glycol monobutyl ether, diethylene glycol n-butyl ether, diisobutyl ketone, dimethyl esters, N,N-dimethylacetamide, N,N-dimethylformamide, dimethylsulfoxide, ethyl acetate (e.g. 85% or 95%), ethyl alcohol (e.g. 95%, denatured, or anhydrous), ethylene dichloride, ethylene glycol monobutyl ether, isophorone, isopropyl acetate, isopropyl alcohol (e.g. 95% or anhydrous), methyl acetate, methyl alcohol, methyl amyl ketone, methyl ethyl ketone, methyl isoamyl ketone, methyl isobutyl ketone, methyl propyl ketone, methylene chloride, N-methyl-2-pyrrolidone, naphtha (light solvent), propyl propionate, propylene dichloride, tetrachloroethylene, tetrahydrofuran, toluene, 1,1,1-trichloroethane, xylene, and combinations thereof (e.g. toluene: ethyl alcohol, 95% (60:40 by weight)).

In one embodiment, the solvent comprises a mixture of isopropyl alcohol and denatured ethyl alcohol.

Unless otherwise specified, a recited evaporation rate for a particular solvent or mixture of solvents is a value that is relative to the evaporation rate at about 25° C. of the standard of n-butyl acetate being established at 1. In an embodiment, the solvent comprises a mixture of a first solvent having an evaporation rate of less than 0.5 times the evaporation rate of n-butyl acetate at about 25° C., and a second solvent having an evaporation rate of more than 2 time the evaporation rate of n-butyl acetate at about 25° C. This addition of two co-solvents—one with a lower evaporation rate—can thereby result in a reduction of paste viscosity to allow for increased deposition control and paste transfer to a substrate. In one aspect, the solvent comprises a mixture of diethylene glycol n-butyl ether and isopropyl alcohol. When the conductive paste is cured at ambient temperature, a ratio of the amount of the first solvent (i.e. slower evaporation) to the amount of the second solvent (i.e. faster evaporation) can be about 1 to 99, about 1 to 15, or about 1 to 10.

In still another embodiment, the solvent has an evaporation rate of less than 0.5. In one aspect of this embodiment, the solvent comprises n-butanol. In another aspect, the solvent comprises diethylene glycol n-butyl ether.

The one or more solvents may be included in the vehicle in an amount of from about 55-90 wt %, from about 60-85 wt %, from about 65-85 wt %, or about 70-75 wt %. The one or more solvents may be included in the conductive paste in an amount of from about 2.75-31.5 wt %, from about 5-31 wt %, from about 7.25-30.5 wt %, or from about 10-30 wt %.

Conductive Material

In accordance with the present subject matter, a conductive material is mixed with the vehicle and delivered and bonded to the surface of a substrate. The conductive material may be physically mixed with the liquid vehicle to create a substantially heterogeneous mixture of conductive material within the vehicle. The conductive material is included at a certain loading amount, so as to provide a sufficient level of conductivity in the fully formed conductive trace.

The conductive material is not particularly limited by the present subject matter, and may include for example, any conductive material in particulate form may be used, wherein the particles have an average size for example, of from 0.005 to 100 microns (μm), such as 0.01 to 10 μm or 0.2 to 10 μm. Two or more populations of particles having different average particle sizes may be used. The particles may have any shape, such as for example, flake shape, rod, cone, sphere, plates, or needle shape, and having, for example, an aspect ratio of about 10 to 1, such as at least about 5 to 1. In one embodiment, the conductive material is of a two dimensional shape, e.g. flake shape.

The conductive material may comprise one or more conductive metals, metal alloys, or mixtures of metals. Suitable conductive materials may include, for example, metals such as gold, silver, nickel, indium, zinc, titanium, copper, chromium, tantalum, tungsten, platinum, palladium, iron, cobalt, and alloys or combinations thereof. The conductive material may also be a base or substrate material coated or plated with one or more of the foregoing metals or alloys, for example silver plated copper flakes or silver plated polymer microspheres. In one embodiment, the conductive material comprises silver or silver plated materials. Silver flakes having an average particle size of from, 0.005 to 10 microns, such as 0.02 to 10 microns, may be used.

The conductive material may be present in the conductive paste in an amount of from about 40-95 wt %, about 60-90 wt %, 80-90 wt %, or about 80-85 wt %. In one embodiment, the surface area/weight ratio of the silver particles is in the range of 0.1-1.0 m$^2$/g.

Gelling Agent

In several embodiments, a gelling agent is included in the conductive pastes and can be added to the vehicle by mechanical mixing. The gelling agent is included as a stability aid for the pastes, to eliminate the material separation of the pastes, and to maintain the pastes as heterogeneous mixtures. The gelling agent is also used to increase the viscosity of the conductive pastes. Furthermore, the gelling agent may inhibit exudation that can occur at higher amounts of plasticizer relative to the polymer resin.

The gelling agent is not particularly limited by the present subject matter, and may include for example, natural gums, starches, pectin's, agar, gum arabic, guar gum, gelatin, carrageenan, locust bean gum, dibenzylidene sorbitol, acacia, alginic acid, bentonite, carbomers, magnesium aluminum silicate, poloxamers, polyvinyl alcohol, sodium alginate, tragacanth, xanthan gum, ceratonia siliqua gum, polyglyceryl-10, behenate, eicosadioate, sugars or sugar derived alcohols, such as mannitol, sorbitol, and the like, starch and starch derivatives, cellulose derivatives, such as microcrystalline cellulose, sodium carboxymethyl cellulose, methylcellulose, ethyl cellulose, hydroxyethyl cellulose, hydroxypropyl cellulose, and hydroxypropyl methylcellulose, attapulgites, bentonites, dextrins, alginates, gum tragacanth, kaolin, lecithin, carbopols, polyvinylpyrrolidone, polyethylene glycol, polyethylene oxide, silicon dioxide, surfactants, mixed surfactant/wetting agent systems, emulsifiers, other polymeric materials, and combinations thereof.

In certain embodiments, the gelling agent comprises dibenzylidene sorbitol. The gelling agent may be included in the conductive paste at an amount of about 0.02-1.5 wt %, or about 0.05-1 wt %, or about 0.1-0.9 wt %.

Defoamer

In accordance with the present subject matter, a defoamer is included in the conductive pastes and can be added to the vehicle by mechanical mixing. The defoamer is included to prevent cavities or inclusions from being formed in the cured conductive trace resulting from the presence of air bubbles in the paste.

The defoamer can include oil based defoamers, powder defoamers, water based defoamers, silicone based defoamers, EO/PO based defoamers, and/or alkyl polyacrylates defoamers. The defoamer may comprise one or more of polyvinyl alcohol, polyethers, diethylhexyl adipate, polymethacrylate, polyvinylacrylate and mixture thereof.

In certain embodiments, the defoamer comprises a silicon-free type defoamer comprising a mixture of about 50-100 wt % of light aromatic solvent naphtha (petroleum), about 0.25-0.5 wt % of 2,6-di-tert-butyl-p-cresol, and about 5-7 wt % of 2-methoxy-1-methylethyl acetate. An example of a suitable defoamer is BYK-A501 available from BYK Additives and Instruments.

The defoamer may be included in the conductive paste at an amount of about 0.01-2 wt %, or about 0.05-0.15 wt %, or about 0.07-0.1 wt %.

Additive

The conductive pastes may contain optional additives for adjusting certain properties of the pastes or of the final cured trace. The additives are not particularly limited by the present subject matter, and can include any additive as desired for a particular application. Additives to be included in the pastes will vary depending on the desired application method, the desired characteristics of the paste or trace, and the like.

Suitable additives can include for example, a thixotrope, an additional solvent(s) that is same or different from those described herein, a coloring agent, binders, a lubricant, a dispersant, a leveling agent, an antistatic agent, an antioxidant, filler, and a chelating agent as desired for a particular application. The additives can be included up to about 20 wt % or more of the conductive pastes.

In one exemplary embodiment, a thixotrope is included from about 0.5-1.5 wt %, or about 0.7-1.0 wt %. The thixotrope is not particularly limited, and can include for example, an organically modified castor oil derivative. A suitable thixotrope for use in the present invention is Thixatrol ST, available from Elementis Specialties.

Substrate and Methods

The conductive paste is typically deposited on a substrate and cured at ambient temperature to form a flexible conductive trace on the substrate. The substrate is not particularly limited, and can comprise any structure upon which it is desired to form a conductive trace. The substrate can comprise a sheet or layer of a composite material made up of a combination of a plastic sheet with optional metallic or dielectric layers deposited thereupon.

The deposition of the conductive paste can be performed by any known liquid deposition method, including for example, syringe deposition, digital printing, screen printing, stencil printing, spin coating, blade coating, rod coating, dip coating, lithography offset printing, gravure, flexography, stamping (such as micro contact printing), or other conventional coating techniques. In one embodiment, syringe deposition is utilized. In one aspect of this embodiment, the solvent is n-butanol, which is utilized because of the evaporation rate of 0.4 can make the paste suitable for such deposition method.

The deposition weight of the conductive paste is not particularly limited by the present subject matter, and a higher deposition weight will increase the amount of time it takes for the trace to cure and achieve a desirably low resistance, while a lower deposition weight will decrease the amount of time it takes for the trace to cure and achieve a desirably low resistance.

Generally, the conductive pastes may be liquid at ambient temperature (e.g. about 15-30° C., or about 20-25° C., or about 23° C.), and therefore may be applied and cured at ambient temperatures and without requiring heating. Further, the conductive pastes do not require heating in order to remove the solvent to cure/harden the pastes to form the conductive traces. While heating is not required, the present subject matter contemplates aspects where heating is used, such as by infra-red ("IR") radiation, a laser beam, flash light, microwave radiation, convection oven, UV radiation, or a combination thereof, either to prepare the pastes, to apply the pastes to a substrate, or once applied to a substrate, to remove the solvent more quickly and cure the polymer so that the pastes form conductive traces.

Several layers of the conductive paste can be printed and dried. The conductive pastes can desirably exhibit a rheology in which the viscosity is about 10-50 Pa·s at 1 rpm and a shear of $3.84\ s^{-1}$. The paste may be shear thinned for application, but thereafter can regain viscosity upon removal of shearing to form a stable pattern on the substrate.

The conductive pastes may be made in any suitable manner. One example method is to first dissolve the polymer resin and plasticizer in the solvent(s), which may be done with the accompanying use of heat and/or stirring to form the vehicle. The conductive material may then be added to the vehicle. Heat and/or agitation may be applied during the addition of the conductive material. Other components discloses herein can also be added to the vehicle.

The substrate upon which the conductive ink is deposited may be any suitable substrate, including, for example, silicon, glass, metal, ceramic, plastic, fabric, or paper. For structurally flexible devices, plastic substrates, such as for example polyester, polycarbonate, polyimide sheets and the like may be used.

Following application to the substrate, the patterned deposited paste is subjected to a curing step. The curing step is a step in which substantially all of the solvent of the ink is removed and the ink is firmly adhered to the substrate. Curing herein does not require a crosslinking or other transformation of the polymer resin, and is performed at ambient temperature, such that when the curing step is completed, the solvent is essentially evaporated.

By removal of substantially all of the solvent is meant that >90% of the solvent is removed from the system. As will be understood, the length of time for curing may vary based upon the amount of solvent, the viscosity, the method used to form the pattern, the amount of paste applied, and the like. For syringe deposition, curing may take from, for example, about less than 5 minutes, less than 2 minutes, or less than one minute. Longer or shorter times may be used, as desired.

Curing can be performed in air, in an inert atmosphere, for example, under nitrogen or argon, or in a reducing atmosphere, for example, under nitrogen containing from 1 to about 20 percent by volume hydrogen. Curing can also be performed under normal atmospheric pressure or at a reduced pressure of, for example, from about 1000 mbars to about 0.01 mbars.

The resulting conductive traces may be used as electrodes, conductive pads, interconnect, conductive lines, conductive tracks, and the like in electronic devices such as thin film transistors, organic light emitting diodes, RFID (radio frequency identification) tags, photovoltaic, displays, printed antenna and other electronic devices or portions thereof which require conductive elements or components.

EXAMPLES

In order to further assess the various aspects and benefits of the present subject matter, a series of investigations were undertaken to evaluate the conductive pastes and conductive traces formed therefrom. In the several examples, the weight percentage (wt %) of the various components may add up to be more or less than 100 wt %. It will be understood that the recited weight percentages for the various components, whether more, less, or equal to 100 wt %, indicate the relative amount of each component.

Several example vehicle and gellant compositions were prepared as outlined below in Table 1, which shows the weight percentage of components for each composition.

Dowanol DB is available from Eastman Chemical Company, and is diethylene glycol n-butyl ether, which is a slow evaporating solvent having an evaporation rate of about 0.0004. CDA-19 Denatured Alcohol (200) is ethanol that has been denatured using a specific formula of additives, i.e. the CDA-19 formula, and is a solvent having an evaporation rate of about 3.3. Isopropyl alcohol has evaporation rate of about 2.9. N-butanol is a solvent have an evaporation rate of about 0.4. M-methyl-2-pyrrrolidone is a solvent having an evaporation rate of about 0.6.

Butvar B-76 and B-98 are polyvinyl butyral resins available from Eastman Chemical Company. Butvar B-76 is a resin having a weight average molecular weight (Mw) of about 90,000-120,000 Daltons (Da). Butvar B-98 is a resin having a weight average molecular weight (Mw) of about 40,000-70,000 Daltons (Da).

Solusolv S-2075 Plasticizer is triethylene glycol bis(2-ethylhexanoate), and is available from Eastman Chemical Company.

Thixatrol ST is a thixatrope of organically modified castor oil derivative available from Elementis Specialties, Inc.

Dibenzylidene Sorbitol is a gelling agent.

BYK-A501 is a silicone-free air release additive available from BYK Additives and Instruments, and is a mixture of about 50-100 wt % of light aromatic solvent naphtha (petroleum), about 0.25-0.5 wt % of 2,6-di-tert-butyl-p-cresol, and about 5-7 wt % of 2-methoxy-1-methylethyl acetate.

Several example conductive paste compositions using vehicle and gellant compositions from Table 1 were prepared as outlined below in Table 2, which shows the weight percentage of components for each paste.

TABLE 1

VEHICLE COMPOSITION

| Material | VEHICLE | | | | | | | | | | | | Gellant |
| --- | --- | --- | --- | --- | --- | --- | --- | --- | --- | --- | --- | --- | --- |
|  | A | B | C | D | E | F | G | H | I | J | K | L | M |
| CDA-19 Denatured Alcohol (200) | 15.80 | 13.22 | 13.33 | 12.88 | — | — | — | — | — | — | — | — | — |
| Dowanol DB(BC) | — | — | — | — | — | 75.00 | — | — | — | — | — | — | — |
| Isopropyl Alcohol | 63.20 | 52.91 | 53.34 | 51.51 | 75.00 | — | — | — | — | — | — | — | — |
| n-Butanol | — | — | — | — | — | — | 75.00 | 76.55 | 71.40 | 70.00 | — | — | — |
| Cycolhexanone | — | — | — | — | — | — | — | — | — | — | 75.00 | 75.00 | — |
| N-Methyl-2-pyrrolidone | — | — | — | — | — | — | — | — | — | — | — | — | 60.00 |
| BUTVAR B-76 | — | — | — | — | — | — | — | — | — | 15.00 | — | — | — |
| BUTVAR B-98 | 15.00 | 25.00 | 20.00 | 19.31 | 15.00 | 15.00 | 15.00 | 10.34 | 12.90 | — | 15.00 | — | — |
| Phenoxy PKHH | — | — | — | — | — | — | — | — | — | — | — | 25.00 | — |
| Solusolv S-2075 Plasticizer | 6.00 | 8.87 | 13.33 | 12.87 | 10.00 | 10.00 | 10.00 | 6.90 | 8.60 | 15.00 | 10.00 | — | — |
| Thixatrol ST | — | — | — | 2.86 | — | — | — | 6.21 | 7.10 | — | — | — | — |
| Dibenzylidene Sorbitol | — | — | — | — | — | — | — | — | — | — | — | — | 40.00 |
| BYK-A501 | — | — | — | 0.57 | — | — | — | — | — | — | — | — | — |
| Total | 100 | 100 | 100 | 100 | 100 | 100 | 100 | 100 | 100 | 100 | 100 | 100 | 100 |
| Resin to Plasticizer Ratio | 2.50 | 2.82 | 1.50 | 1.50 | 1.50 | 1.50 | 1.50 | 1.50 | 1.50 | 1.00 | 1.5 | n/a | n/a |

TABLE 2

EXAMPLES

| Material | EXAMPLES | | | | | | | | |
| --- | --- | --- | --- | --- | --- | --- | --- | --- | --- |
|  | 1 | 2 | 3 | 4 | 5 | 6 | 7 | 8 | 9 |
| BYK-A501 | — | 0.10 | 0.10 | 0.10 | 0.10 | 0.10 | 0.10 | 0.10 | — |
| Isopropyl Alcohol | — | — | — | 0.75 | — | — | — | — | — |
| n-Butanol | — | — | — | — | — | 1.90 | 4.32 | 4.15 | — |
| Silver Flake | 82.50 | 82.50 | 82.50 | 82.50 | 82.50 | 82.50 | 82.50 | 82.50 | 82.50 |
| Vehicle C | — | 16.40 | — | — | — | — | — | — | — |
| Vehicle D | 17.50 | — | — | — | — | — | — | — | — |
| Vehicle E | — | — | 14.76 | 14.76 | — | — | — | — | — |
| Vehicle F | — | — | 1.64 | 1.64 | — | — | — | — | — |
| Vehicle G | — | — | — | — | — | — | 12.00 | — | — |
| Vehicle H | — | — | — | — | 17.40 | — | — | — | — |

TABLE 2-continued

EXAMPLES

| Material | 1 | 2 | 3 | 4 | 5 | 6 | 7 | 8 | 9 |
|---|---|---|---|---|---|---|---|---|---|
| Vehicle I | — | — | — | — | — | 15.50 | — | — | — |
| Vehicle J | — | — | — | — | — | — | — | 12.00 | — |
| Vehicle K | — | — | — | — | — | — | — | — | 12.00 |
| Vehicle L | — | — | — | — | — | — | — | — | 5.50 |
| Gellant Intermediate | — | 1.00 | 1.00 | 0.25 | — | — | — | — | — |
| Gellant M | — | — | — | — | — | — | — | 0.50 | — |
| Thixatrol ST | — | — | — | — | — | — | 1.08 | 0.75 | — |
| Total | 100.00 | 100.00 | 100.00 | 100.00 | 100.00 | 100.00 | 100.00 | 100.00 | 100.00 |

Figure 2:
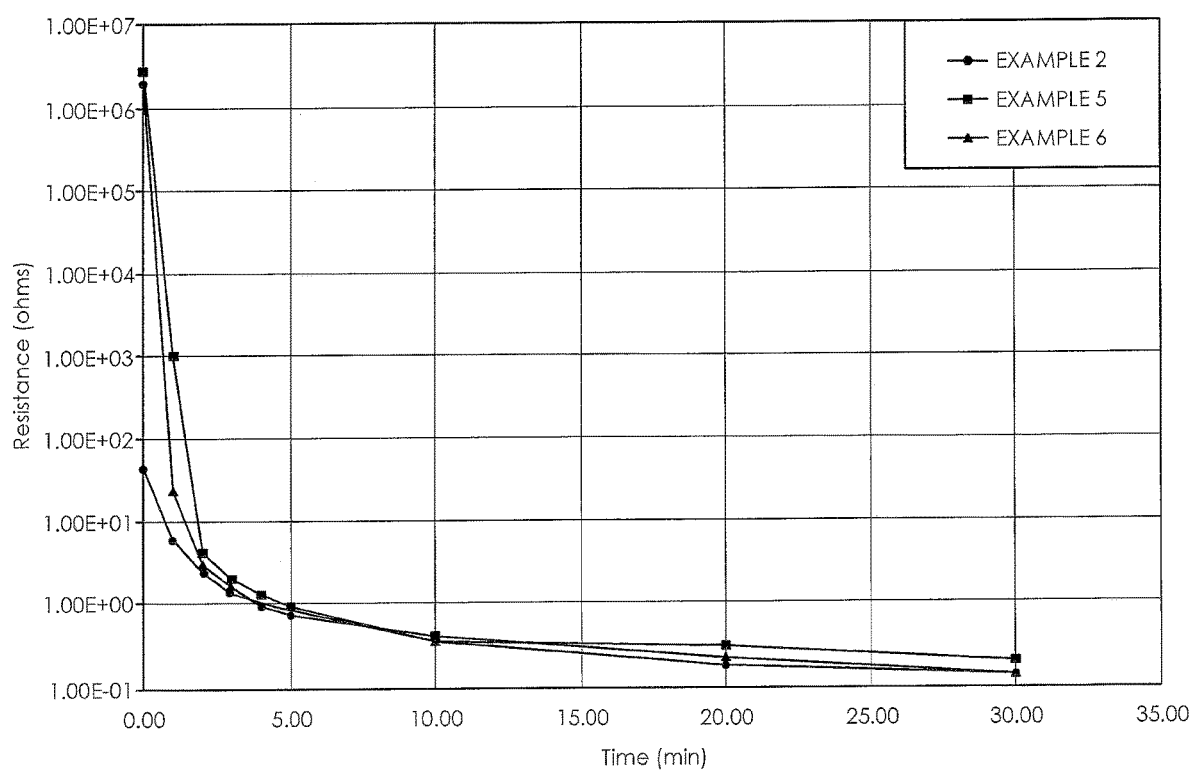
FIG. 2 is a graph of recorded data for the resistance of example conductive pastes in accordance with the present subject matter with respect to time.
Figure 3:
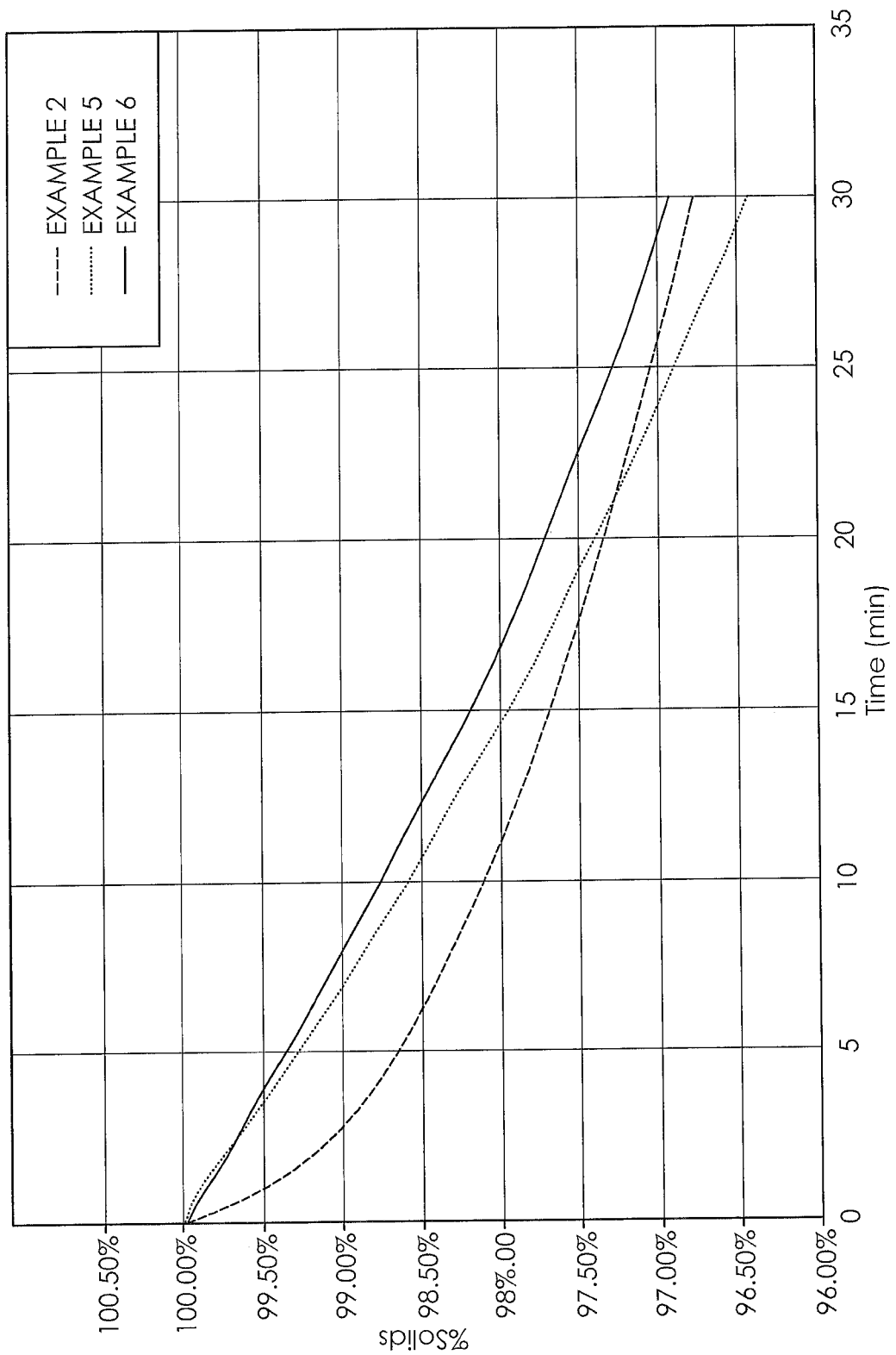
FIG. 3 is a graph of recorded data for the evaporation rate of example conductive pastes in accordance with the present subject matter with respect to time.

Evaluations of several of the examples from Table 2 were performed to evaluate certain properties of the conductive pastes. Conductive pastes of Examples 2, 5 and 6 were applied to a substrate in a volume of 1 cm³, and the resistivity and evaporation rates of the pastes were evaluated with respect to time. As shown in FIGS. 1 and 2, the resistance of the example pastes quickly decrease from their initial value to below $1.00 \times 10^4$ ohms ($\Omega$) on a predetermined pattern within 1 minute from application of the conductive paste to the substrate. Within five minutes, the resistance of the example pastes decreased to below 1.00 ohm (0) on a predetermined pattern and continued decreasing for up to at least four hours. In FIG. 3, which is a plot of the weight of the deposited sample, represented by "% solids" on the Y-axis, with respect to time on the X-axis, it can be seen that Example 2, which contained a combination of two fast evaporating solvents, i.e. denatured alcohol (evaporation rate of 3.3) and isopropyl alcohol (evaporation rate of 2.9), had a faster evaporation rate than Examples 5 and 6, which contained a slow evaporating solvent, i.e. N-butanol (evaporation rate of 0.4).

As demonstrated by the above results, Example 2, which included a solvent with a faster evaporation rate, had a lower initial resistance than Examples 5 and 6, which included a slower evaporation rate solvent. However, Examples 5 and 6 were able to achieve similar low resistance as in Example 2 within about two minutes. Furthermore, because Examples 5 and 6 included slower evaporation rate solvents, they indicated a low likeliness of dry skin formation on the surface of the droplet of paste during syringe application. This aspect of Examples 5 and 6 should help address deposition issues that may arise when using the paste of Example 2 in syringe deposition methods.

Figure 4:
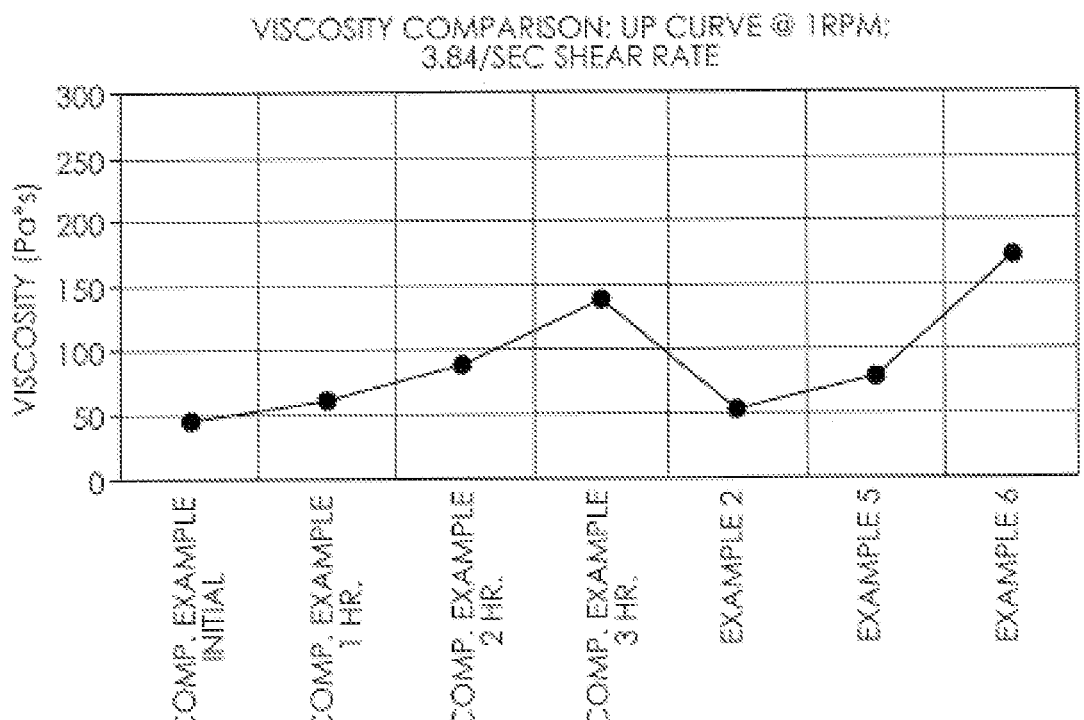
FIG. 4 is a graph of recorded data for the viscosity up curve of example conductive pastes in accordance with the present subject matter and a comparative example conductive paste with respect to time.
Figure 5:
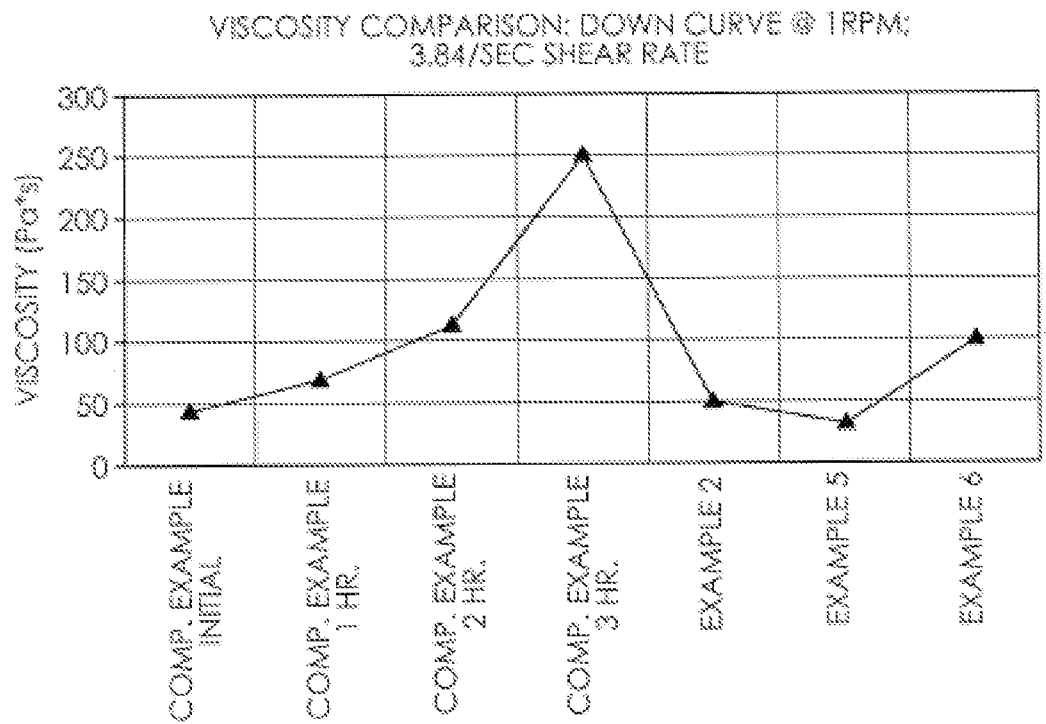
FIG. 5 is a graph of recorded data for the viscosity down curve of example conductive pastes in accordance with the present subject matter and a comparative example conductive paste with respect to time.

As shown in FIGS. 4 and 5, Examples 2, 5, and 6 were evaluated for viscosity up curve and down curve at 1 rpm; 3.84/sec Shear Rate; and the results were compared to a Comparative Example 1 with respect to time. Comparative Example 1 was a two part epoxy based silver conductive paste composed of 82.5 wt % silver flake, 0.08 wt % defoamer (BYK-A501), 2 wt % plasticizer (Viplex LS), 7.3 wt % high and low viscosity epoxy resin (Der 732 Epoxy Resin and Epon Resin 828), and 8.13 wt % curing agent (Ancamide 2137), which was used as a standard. As demonstrated in FIGS. 4-5, Examples 2, 5, and 6 yield viscosities (up-curve) in line with Comparative Example 1 initially, at the two-hour mark, and at the three-hour mark respectively. The lower down-curve viscosities of Examples 5 and 6 clearly shows the shear thinning behavior of the conductive pastes. The shear thinning behavior of Examples 5 and 6 can aid in the fine tuning of droplet size formation through the manipulation of air pressure in syringe application methods.

Figure 6:
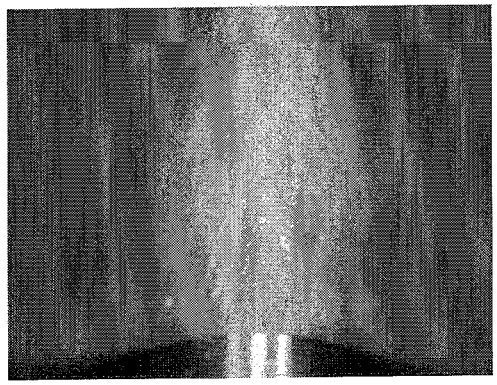
FIG. 6 is a photograph of a layer of conductive material in accordance with the present subject matter that has been cured on a substrate that has been bent.
Figure 7:
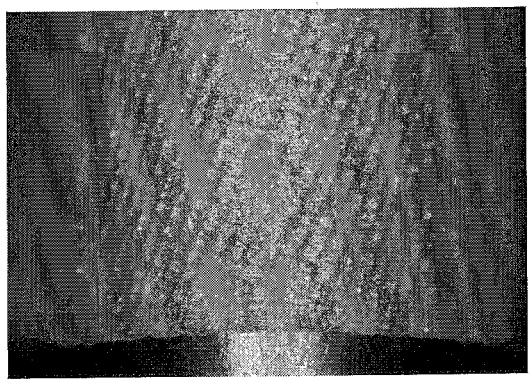
FIG. 7 is a photograph of a layer of another conductive material in accordance with the present subject matter that has been cured on a substrate that has been bent.
Figure 8:
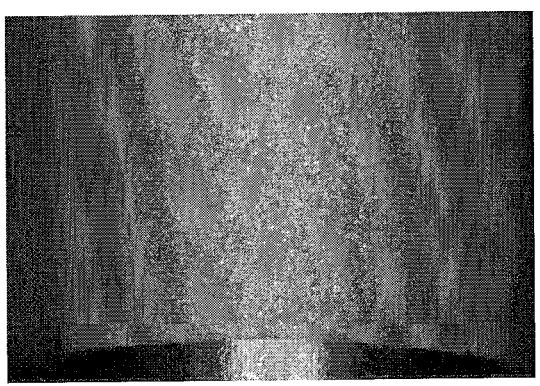
FIG. 8 is a photograph of a layer of still another conductive material in accordance with the present subject matter that has been cured on a substrate that has been bent.
Figure 9:
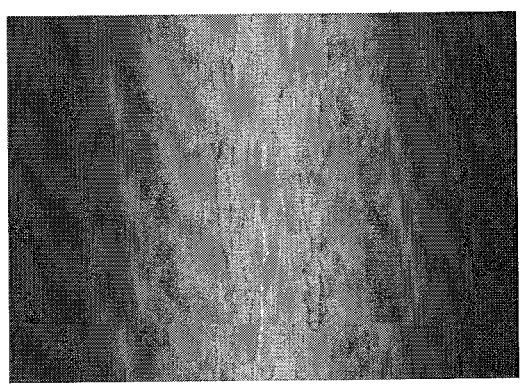
FIG. 9 is a photograph of a layer of a conductive material without plasticizer that has been cured on a substrate that has been bent.

FIGS. 6-9 are photographs of conductive films formed from conductive pastes. FIG. 6 is the film of Comparative Example 1, FIG. 7 is the film of Example 5, FIG. 8 is the film of Example 6, and FIG. 9 is the film of a paste in accordance with the present subject matter, except that it did not include a plasticizer. The films were applied by screen printing with a 35-100 μm thickness and dried on a brass sheet having a 0.35 mm thickness. The brass sheets were bent as depicted in the photographs of FIGS. 6-9 and the area of the film over the bend were evaluated under a microscope (100× magnification) for stress cracks. Examples 5 and 6 exhibited excellent flexibility comparable to that of Comparative Example 1. The film shown in FIG. 9, which did not include a plasticizer, showed stress cracks, which can been seen in FIG. 9.

Figure 10:
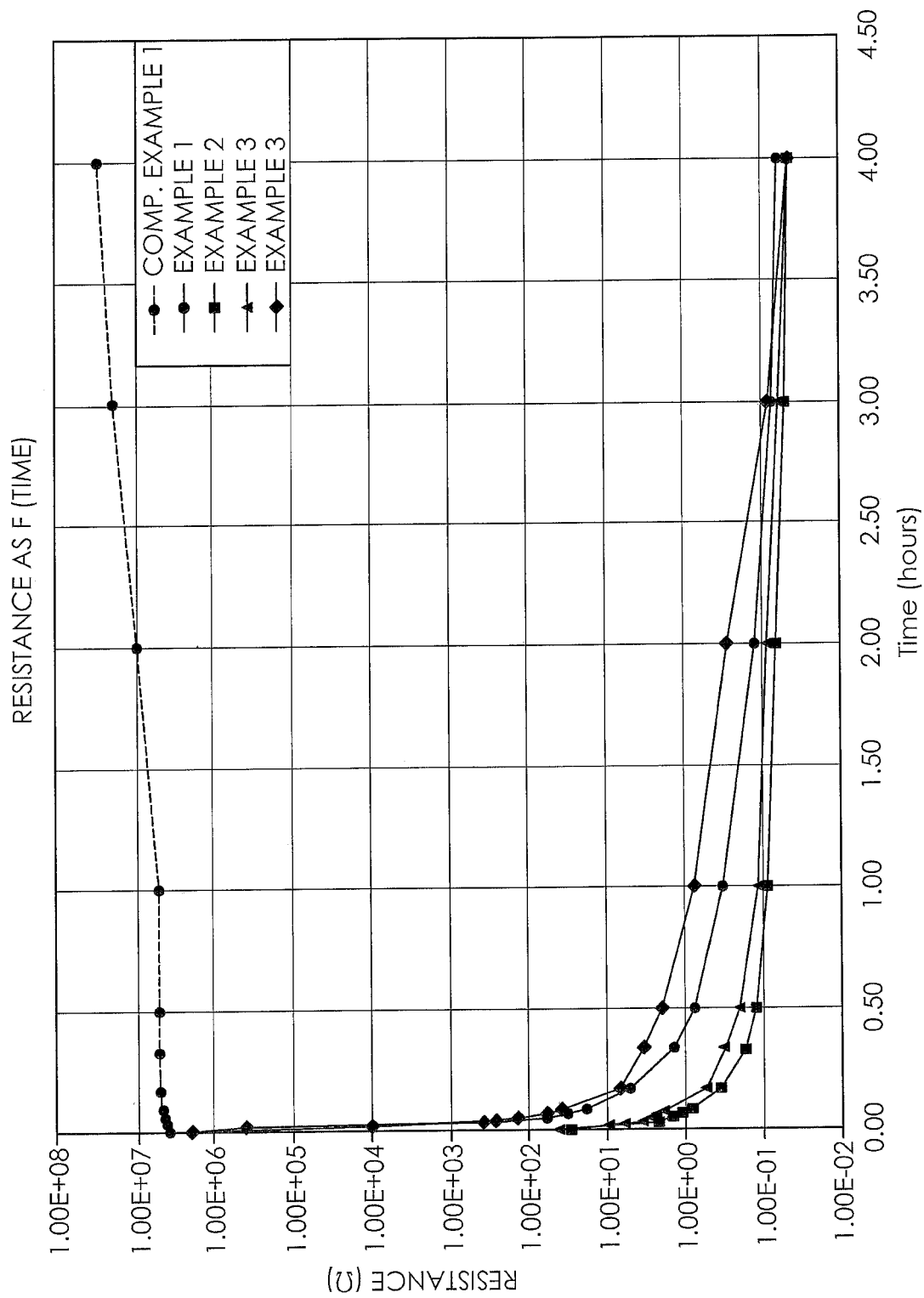
FIG. 10 is a graph of recorded data for the resistance of example conductive pastes in accordance with the present subject matter and a comparative example with respect to time.

Conductive pastes of Examples 1-4 were applied to a substrate in a volume of 1 cm³, and the resistivity of the pastes were evaluated with respect to time. As shown in FIG. 10, the resistivity of the example pastes quickly decrease from their initial value. Examples 1 and 2, which contained a combination of two fast evaporating solvents, i.e. denatured alcohol (evaporation rate of 3.3) and isopropyl alcohol (evaporation rate of 2.9), had a lower initial resistance than Examples 3 and 4, which contained a combination of a fast evaporating solvent, i.e. isopropyl alcohol (evaporation rate of 2.9), and a slow evaporating solvent, i.e. Dowanol DB (evaporation rate of 0.0004). All the pastes of Examples 1-4 reached a resistance below $1.00 \times 10^1$ ohms ($\Omega$) on a predetermined pattern within 15 minutes from application of the conductive paste to the substrate.

Figure 11:
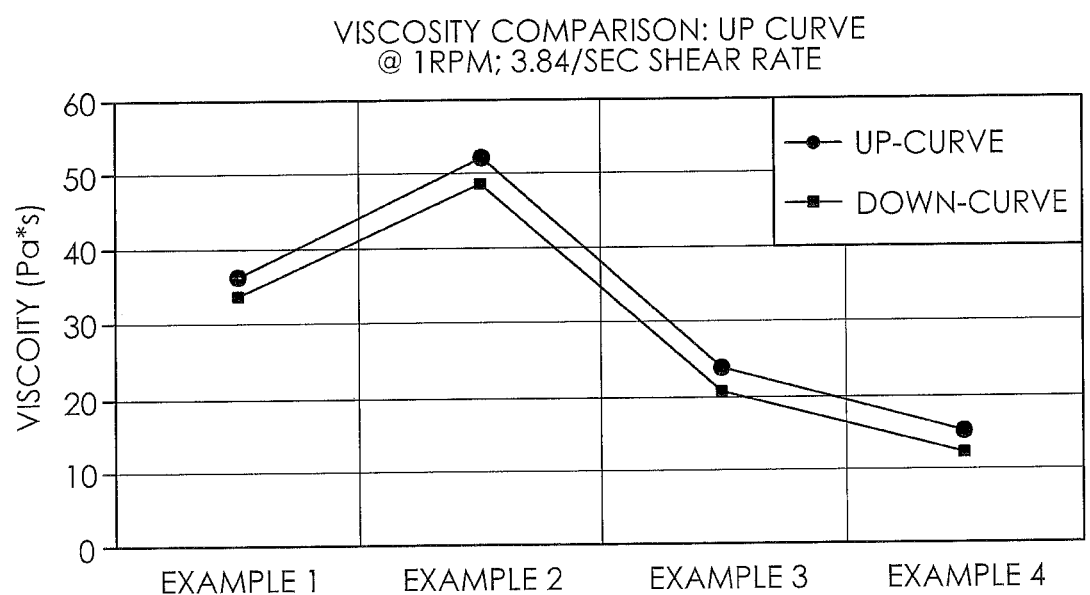
FIG. 11 is a graph of recorded data for the viscosity up curve and down curve of example conductive pastes in accordance with the present subject matter with respect to time.

As shown in FIG. 11, Examples 1-4 were evaluated for viscosity up curve and down curve at 1 rpm; 3.84/sec Shear Rate. As demonstrated, Examples 1 and 2 yielded higher viscosities (up-curve) than Examples 3 and 4.

The invention is further defined by the following items.

Item 1. A lead, cadmium, and phthalate free conductive paste comprising 60-90 wt % conductive material including silver particles, and 10-30 wt % of a binder system,
  Wherein 100 wt % of the binder system includes:
    10-20 wt % thermoplastic polymer resin comprising polyvinyl butyral,
    5-20 wt % plasticizer comprising triethylene glycol bis(2-ethylhexanoate), and
    60-85 wt % solvent,
  wherein the thermoplastic polymer resin is dissolved in the solvent,
  wherein a weight ratio of the amount of thermoplastic polymer resin to the amount of plasticizer is 1.25 to 1.75, and wherein when the conductive paste is applied to an associated substrate, 0.5-1 wt % of the solvent evaporates from the conductive paste at ambient temperature within 5 minutes.

Item 2. The conductive paste according to item 1, further comprising 0.5-1.5 wt % of a thixotrope.

Item 3. The conductive paste according to item 1, further comprising 0.05-0.15 wt % defoamer.

Item 4. The conductive paste according to item 1, further comprising 0.05-1 wt % of a gelling agent.

Item 5. The conductive paste according to item 4, wherein the gelling agent comprises dibenzylidene sorbitol.

Item 6. The conductive paste according to item 1, wherein the solvent comprises a mixture of isopropyl alcohol and denatured ethyl alcohol.

Item 7. The conductive paste according to item 1, wherein the solvent is a mixture of a first solvent having an evaporation rate of less than 0.5 times the evaporation rate of n-butyl acetate at 25° C., and a second solvent having an evaporation rate of more than 2 times the evaporation rate of n-butyl acetate at 25° C.

Item 8. The conductive paste according to item 7, wherein the first solvent is diethylene glycol n-butyl ether and the second solvent is isopropyl alcohol.

Item 9. The conductive paste according to item 1, wherein the solvent is n-butanol.

Item 10. A method of forming a flexible conductive trace on a substrate, the method comprising:
(a) providing a lead, cadmium, and phthalate free conductive paste including 60-90 wt % conductive material, and 10-30 wt % of a binder system,
wherein 100 wt % of the binder system includes 10-20 wt % thermoplastic polymer resin, 5-20 wt % plasticizer, and 60-85% solvent,
wherein the thermoplastic polymer resin is dissolved in the solvent, and
wherein a weight ratio of the amount of thermoplastic polymer resin to the amount of plasticizer is 1.25 to 1.75,
(b) applying the conductive paste to a substrate in a predetermined pattern; and
(c) curing the conductive paste by allowing the solvent to evaporate from the conductive paste at ambient temperature to thereby form the flexible conductive trace on the substrate,
wherein 0.5-1 wt % of the solvent evaporates from the conductive paste within 5 minutes after application of the conductive paste to the substrate, and
wherein the predetermined pattern of conductive paste achieves an electrical resistance of less than $1.00 \times 10^4$ ohms ($\Omega$) within 1 minute from application to the substrate, and less than 1 ohm within 5 minutes from application to the substrate.

Item 11. The method according to item 10, wherein the binder system includes:
12.5-17.5 wt % of the polymer resin,
8-10 wt % of the plasticizer, and
70-75 wt % of the solvent.

Item 12. The method according to item 10, wherein the conductive paste further comprises 0.05-0.15 wt % defoamer.

Item 13. The method according to item 10, wherein the conductive paste further comprise 0.5-1.5 wt % of a thixotrope.

Item 14. The method according to item 10, wherein the conductive paste further comprises 0.05-1 wt % of a gelling agent.

Item 15. The method according to item 10, wherein the polymer resin comprises polyvinyl butyral.

Item 16. The method according to item 15, wherein the plasticizer comprises triethylene glycol bis(2-ethylhexanoate).

Item 17. The method according to item 10, wherein the solvent is a mixture of a first solvent having an evaporation rate of less than 0.5 times the evaporation rate of n-butyl acetate at 25° C., and a second solvent having an evaporation rate of more than 2 times the evaporation rate of n-butyl acetate at 25° C.

Item 18. The method according to item 17, wherein the first solvent is diethylene glycol n-butyl ether and the second solvent is isopropyl alcohol.

Item 19. The method according to item 10, wherein the solvent comprises n-butanol.

Item 20. The method according to item 10, wherein the conductive paste is applied to the substrate by one selected from the group consisting of syringe deposition, digital printing, screen printing, or combinations thereof.

Item 21. A lead, cadmium, and phthalate free conductive paste, comprising:
about 5-35 wt % of a binder system including polymer resin, plasticizer, and solvent, wherein the polymer resin is dissolved in the solvent and wherein a weight ratio of the amount of polymer resin to the amount of plasticizer is about 1.25 to about 1.75, and
about 60-90 wt % conductive material,
wherein the solvent evaporates at ambient temperature at a rate of about 0.5-1 wt % in the first 5 minutes after application of the conductive paste to an associated substrate, and the conductive paste achieves an electrical resistance of less than $1.00 \times 104$ ohms ($\Omega$) on a predetermined pattern within 1 minute from application to the substrate, and less than 1 ohm on the predetermined pattern within 5 minutes from application of the conductive paste to the substrate to thereby form a flexible conductive trace at ambient temperature.

Item 22. The conductive paste according to item 21, wherein the binder system includes:
about 10-20 wt % of the polymer resin,
about 5-15 wt % of the plasticizer, and
about 60-85 wt % of the solvent.

Item 23. The conductive paste according to item 21, further comprising about 0.5-1.5 wt % of a thixotrope.

Item 24. The conductive paste according to item 21, further comprising about 0.05-0.15 wt % defoamer.

Item 25. The conductive paste according to item 21, further comprising about 0.05-1 wt % of a gelling agent.

Item 26. The conductive paste according to item 25, wherein the gelling agent comprises dibenzylidene sorbitol.

Item 27. The conductive paste according to item 21, wherein the polymer resin comprises polyvinyl butyral.

Item 28. The conductive paste according to item 27, wherein the plasticizer comprises triethylene glycol bis(2-ethylhexanoate).

Item 29. The conductive paste according to item 21, wherein the solvent comprises a mixture of isopropyl alcohol and denatured ethyl alcohol.

Item 30. The conductive paste according to item 21, wherein the solvent comprises a mixture of a first solvent having an evaporation rate of less than 0.5 times the evaporation rate of n-butyl acetate, and a second solvent having an evaporation rate of more than 2 times the evaporation rate of n-butyl acetate.

Item 31. The conductive paste according to item 30, wherein the solvent comprises a mixture of diethylene glycol n-butyl ether and isopropyl alcohol.

Item 32. The conductive paste according to item 21, wherein the solvent comprises n-butanol.

Item 33. The conductive paste according to item 21, wherein the conductive material comprises silver particles.

Item 34. A method of forming a conductive trace comprising:
providing a conductive paste comprising, (a) about 5-35 wt % of a binder system including polymer resin, plasticizer, and solvent, wherein the polymer resin is dissolved in the solvent, and wherein a weight ratio of the amount of polymer resin to the amount of plasticizer is about 1.25 to about 1.75, and (b) about 60-90 wt % conductive material;
applying the conductive paste to a substrate in a predetermined pattern; and
curing the conductive paste at ambient temperature by allowing the solvent to evaporate from the conductive paste, thereby forming a flexible conductive trace on the substrate,
wherein the solvent evaporates at ambient temperature at a rate of about 0.5-1 wt % in the first 5 minutes after application of the conductive paste to the substrate,
wherein the flexible conductive trace achieves an electrical resistance of less than $1.00 \times 10^4$ ohms ($\Omega$) on the predetermined pattern within 1 minute from application to the substrate, and less than 1 ohm on the predetermined pattern within 5 minutes from application to the substrate at ambient temperature.

Item 35. The method according to item 34, wherein the binder system includes:
about 10-20 wt % of the polymer resin,
about 5-15 wt % of the plasticizer, and
about 60-85 wt % of the solvent.

Item 36. The method according to item 34, wherein the conductive paste further comprises about 0.05-0.15 wt % defoamer.

Item 37. The method according to item 34, wherein the conductive paste further comprise about 0.5-1.5 wt % of a thixotrope.

Item 38. The method according to item 34, wherein the conductive paste further comprises about 0.05-1 wt % of a gelling agent.

Item 39. The method according to item 38, wherein the gelling agent comprises dibenzylidene sorbitol.

Item 40. The method according to item 34, wherein the polymer resin comprises polyvinyl butyral.

Item 41. The method according to item 40, wherein the plasticizer comprises triethylene glycol bis(2-ethylhexanoate).

Item 41. The method according to item 34, wherein the solvent comprises a mixture of diethylene glycol n-butyl ether and isopropyl alcohol.

Item 42. The method according to item 34, wherein the solvent comprises a mixture of isopropyl alcohol and denatured ethyl alcohol.

Item 43. The method according to item 34, wherein the solvent comprises n-butanol.

Item 44. The method according to item 34, wherein the conductive material comprises silver particles.

Item 45. The method according to item 34, wherein the conductive paste is applied to the substrate by one selected from the group consisting of syringe deposition, digital printing, screen printing, or combinations thereof.

Many other benefits will no doubt become apparent from future application and development of this technology.

All patents, applications, standards, and articles noted herein are hereby incorporated by reference in their entirety.

The present subject matter includes all operable combinations of features and aspects described herein. Thus, for example if one feature is described in association with an embodiment and another feature is described in association with another embodiment, it will be understood that the present subject matter includes embodiments having a combination of these features.

As described hereinabove, the present subject matter solves many problems associated with previous strategies, systems and/or devices. However, it will be appreciated that various changes in the details, materials and arrangements of components, which have been herein described and illustrated in order to explain the nature of the present subject matter, may be made by those skilled in the art without departing from the principle and scopes of the claimed subject matter, as expressed in the appended claims.

What is claimed is:

1. A lead, cadmium, glass frit, and phthalate free conductive paste comprising 80-90 wt % conductive material comprising silver particles, and 10-20 wt % of a binder system,
wherein 100 wt % of the binder system includes:
10-20 wt % thermoplastic polymer resin comprising polyvinyl butyral,
5-20 wt % plasticizer comprising triethylene glycol bis (2-ethylhexanoate), and
70-75 wt % solvent,
wherein the thermoplastic polymer resin is dissolved in the solvent, wherein a weight ratio of the amount of thermoplastic polymer resin to the amount of the plasticizer is 1.25 to 1.75,
wherein when the conductive paste is applied to an associated substrate, within 5 minutes at ambient temperature, the conductive paste loses 0.5-1 wt % of its total weight by evaporation of the solvent,
wherein, without requiring heating, curing agent, infrared (IR) radiation, laser beam, flash light, microwave radiation, UV radiation, or a combination thereof, a flexible conductive trace formed from the conductive paste on the substrate, wherein
the flexible conductive trace of the conductive paste achieves an electrical resistance of less than $1.00 \times 10^4$ ohms ($\Omega$) within 1 minute of applying the conductive paste at ambient temperature to the substrate, and achieves an electrical resistance of less than 1 ohm within 5 minutes of applying the conductive paste at ambient temperature to the substrate, and wherein the flexible conductive trace formed from the conductive paste achieves a modulus of elasticity of about $1-4 \times 10^3$ psi as measured by ASTM D790-59T.

2. The conductive paste according to claim 1, further comprising 0.5-1.5 wt % of a thixotrope.

3. The conductive paste according to claim 1, further comprising 0.05-0.15 wt % defoamer.

4. The conductive paste according to claim 1, further comprising 0.05-1 wt % of a gelling agent.

5. The conductive paste according to claim 4, wherein the gelling agent comprising dibenzylidene sorbitol.

6. The conductive paste according to claim 1, wherein the solvent comprising a mixture at isopropyl alcohol and denatured ethyl alcohol.

7. The conductive paste according to claim 1, wherein the solvent is a mixture of a first solvent having an evaporation rate of less than 0.5 times the evaporation rate of n-butyl acetate at 25° C., and a second solvent having an evaporation rate of more than 2 times the evaporation rate of n-butyl acetate at 25° C.

8. The conductive paste according to claim 7, wherein the first solvent is diethylene glycol n-butyl ether and the second solvent is isopropyl alcohol.

9. The conductive paste according to claim 1, wherein the solvent is n-butanol.

10. A method of forming a flexible conductive trace on a substrate, the method comprising:
(a) providing a lead, cadmium, glass frit, and phthalate free conductive paste including 80-90 wt % conductive material, and 10-20 wt % of a binder system,
wherein 100 wt % of the binder system includes 10-20 wt % thermoplastic polymer resin, 5-20 wt % plasticizer, and 70-75 wt % solvent,
wherein the thermoplastic polymer resin is dissolved in the solvent, and
wherein a weight ratio of the amount of thermoplastic polymer resin to the amount of the plasticizer is 1.25 to 1.75, and
(b) applying the conductive paste to a substrate in a predetermined pattern; and
(c) curing the conductive paste by allowing the solvent to evaporate from the conductive paste at ambient temperature and without requiring heating, curing agent, infra-red (IR) radiation, laser beam, flash light, microwave radiation, UV radiation, or a combination thereof to thereby form a flexible conductive trace on the substrate,
wherein within 5 minutes after application of the conductive paste to the substrate at ambient temperature, the conductive paste loses 0.5-1 wt % of its total weight by evaporation of the solvent, and
wherein the flexible conductive trace achieves an electrical resistance of less than $1.00 \times 10^4$ ohms ($\Omega$) within 1 minute from application of the conductive paste to the substrate at ambient temperature, and the flexible conductive trace achieves an electrical resistance of less than 1 ohm within 5 minutes from application of the conductive paste to the substrate, and wherein the flexible conductive trace achieves a modulus of elasticity of about $1-4 \times 10^3$ psi as measured by ASTM D790-59T.

11. The method according to claim 10, wherein the binder system includes:
12.5-17.5 wt % of the polymer resin,
8-10 wt % of the plasticizer, and
70-75 wt % of the solvent.

12. The method according to claim 10, wherein the conductive paste further comprises 0.05-0.15 wt % defoamer.

13. The method according to claim 10, wherein the conductive paste further comprising 0.5-1.5 wt % of a thixotrope.

14. The method according to claim 10, wherein the conductive paste further comprising 0.05-1 wt % of a gelling agent.

15. The method according to claim 10, wherein the polymer resin comprising polyvinyl butyral.

16. The method according to claim 15, wherein the plasticizer comprising triethylene glycol bis(2-ethylhexanoate).

17. The method according to claim 10, wherein the solvent is a mixture of a first solvent having an evaporation rate of less than 0.5 times the evaporation rate of n-butyl acetate at 25° C., and a second solvent having an evaporation rate of more than 2 times the evaporation rate of n-butyl acetate at 25° C.

18. The method according to claim 17, wherein the first solvent is diethylene glycol n-butyl ether and the second solvent is isopropyl alcohol.

19. The method according to claim 10, wherein the solvent comprising n-butanol.

20. The method according to claim 10, wherein the conductive paste is applied to the substrate by one selected from the group consisting of syringe deposition, digital printing, screen printing, or combinations thereof.

21. A lead, cadmium, glass frit, and phthalate free conductive paste comprising 80-90 wt % conductive material comprising silver particles, and 10-20 wt % of a binder system,
wherein 100 wt % of the binder system includes:
25-30 wt % thermoplastic polymer resin comprising polyvinyl butyral, and 70-75 wt % solvent,
wherein the thermoplastic polymer resin is dissolved in the solvent, and
wherein the conductive paste is applied to an associated substrate at ambient temperature to form a flexible conductive trace, wherein
within 5 minutes of the application of the conductive paste to the associated substrate at ambient temperature, the conductive paste loses 0.5-1 wt % of its total weight by evaporation of the solvent,
wherein, without requiring heating, curing agent, infrared (IR) radiation, laser beam, flash light, microwave radiation, UV radiation, or a combination, the flexible conductive trace achieves an electrical resistance of less than $1.00 \times 10^4$ ohms ($\Omega$) within 1 minute from application of the conductive paste at ambient temperature to the substrate, wherein the flexible conductive trace achieves an electrical resistance less than 1 ohm within 5 minutes from application of the conductive paste at ambient temperature to the substrate, and a wherein the flexible conductive trace achieves modulus of elasticity of about $1-4 \times 10^3$ psi as measured by ASTM D790-59T.

22. The conductive paste according to claim 21, wherein the solvent comprising cyclohexanone.

23. The conductive paste according to claim 21, wherein the thermoplastic polymer resin comprising polyvinyl butyral and phenoxy resin.

24. A method of forming a flexible conductive trace on a substrate, the method comprising:
(a) providing a lead, cadmium, glass frit and phthalate free conductive paste including 80-90 wt % conductive material, and 10-20 wt % of a binder system,
wherein 100 wt % of the binder system includes 25-30 wt % thermoplastic polymer resin, and 70-75 wt % solvent,
wherein the thermoplastic polymer resin is dissolved in the solvent,
(b) applying the conductive paste to a substrate in a predetermined pattern; and
(c) curing the conductive paste by allowing the solvent to evaporate from the conductive paste at ambient temperature, without requiring heating, curing agent, infrared (IR) radiation, laser beam, flash light, microwave radiation, UV radiation, or a combination thereof to thereby form a flexible conductive trace on the substrate,
wherein within 5 minutes after application of the conductive paste to the substrate at ambient temperature, the conductive paste loses 0.5-1 wt % of its total weight by evaporation of the solvent, and wherein the flexible conductive trace achieves an electrical resistance of less than $1.00\times10^4$ ohms ($\Omega$) within 1 minute from application of the conductive paste at ambient temperature to the substrate, and the flexible conductive trace achieves an electrical resistance of less than 1 ohm within 5 minutes from application of the conductive paste at ambient temperature to the substrate, and wherein the flexible conductive trace achieves a modulus of elasticity of about $1\text{-}4\times10^3$ psi as measured by ASTM D790-59T.

25. The method according to claim 24, wherein the solvent comprising cyclohexanone.

26. The method according to claim 24, wherein the thermoplastic polymer resin comprising polyvinyl butyral and phenoxy resin.

27. The method according to claim 24, wherein the conductive paste is applied to the substrate by syringe deposition.

* * * * *